US008773215B2

(12) United States Patent
Sadhu et al.

(10) Patent No.: US 8,773,215 B2
(45) Date of Patent: Jul. 8, 2014

(54) FULLY DECOUPLED LC-TANK BASED OSCILLATOR TOPOLOGY FOR LOW PHASE NOISE AND HIGH OSCILLATION AMPLITUDE APPLICATIONS

(75) Inventors: Bodhisatwa Sadhu, Minneaplois, MN (US); Jean-Oliver Plouchart, New York, NY (US); Scott K. Reynolds, Amawalk, NY (US); Alexander V. Rylyakov, Mount Kisco, NY (US); Jose A. Tierno, Stamford, CT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/228,779

(22) Filed: Sep. 9, 2011

(65) Prior Publication Data

US 2013/0063218 A1 Mar. 14, 2013

(51) Int. Cl.
H03B 1/00 (2006.01)
(52) U.S. Cl.
USPC ............... 331/167; 331/117 R; 331/117 FE
(58) Field of Classification Search
USPC ............................. 331/167, 117 R, 117 FE
See application file for complete search history.

(56) References Cited

U.S. PATENT DOCUMENTS

| 4,677,396 | A | * | 6/1987 | Cruz et al. ............... 331/117 R |
| 4,706,045 | A | | 11/1987 | Ouyang et al. |
| 5,818,306 | A | | 10/1998 | Lee et al. |
| 6,064,277 | A | | 5/2000 | Gilbert |
| 6,204,734 | B1 | | 3/2001 | Zhang et al. |
| 6,469,587 | B2 | * | 10/2002 | Scoggins ................. 331/117 R |
| 6,700,451 | B1 | | 3/2004 | Peckham et al. |
| 6,838,952 | B2 | | 1/2005 | Ramet |
| 6,943,637 | B2 | | 9/2005 | Ruffieux |
| 6,946,924 | B2 | | 9/2005 | Chominski |
| 7,064,622 | B2 | * | 6/2006 | Jasa et al. ................. 331/117 R |
| 7,126,435 | B2 | | 10/2006 | Naviasky et al. |
| 8,044,733 | B1 | | 10/2011 | Arora et al. |
| 2007/0063781 | A1 | | 3/2007 | Huynh |
| 2009/0072920 | A1 | | 3/2009 | Wachi et al. |
| 2009/0273407 | A1 | | 11/2009 | Kim |
| 2010/0327986 | A1 | | 12/2010 | Mishra et al. |
| 2012/0001699 | A1 | | 1/2012 | Yang et al. |

OTHER PUBLICATIONS

Chuang et al., "A New CMOS VCO Topology with Capacitive Degeneration and Transformer Feedback", 2006 International Symposium on Digital Object Identifier, Apr. 2006, pp. 1-4.
Troedsson et al., "High performance 1 V 2.4 GHz CMOS VCO", 2002 IEEE Asia-Pacific Conference on Digital Object Identifier, Nov. 2002, pp. 185-188.
Tietze, U., et al. "Halbleiter-Schaltungstechnik" 13. Auflage. Springer-Verlag, 2010. (ISBN 978-3-642-01621-9) pp. 1515-1517, 1523-1525.
Wachi et al., "A 28GHz Low-Phase-Noise CMOS VCO Using an Amplitude-Redistribution Technique" ISSCC 2008. Digest of Technical Papers. IEEE International, Feb. 2008. (16 pages).

* cited by examiner

*Primary Examiner* — Arnold Kinkead
(74) *Attorney, Agent, or Firm* — Tutunjian & Bitetto, P.C.; Anne V. Dougherty

(57) ABSTRACT

There is provided a tank based oscillator. The oscillator includes one or more active devices, one or more passive devices, and a tank circuit decoupled from the active devices using at least one of the one or more passive devices. A coupling ratio between the tank circuit and the one or more active devices is set such that a maximum value of an oscillation amplitude of the tank circuit is limited based upon a breakdown of only the one or more passive devices.

25 Claims, 6 Drawing Sheets

FULLY DECOUPLED LC-TANK BASED OSCILLATOR TOPOLOGY FOR LOW PHASE NOISE AND HIGH OSCILLATION AMPLITUDE APPLICATIONS

GOVERNMENT RIGHTS

This invention was made with Government support under Contract No.: FA8650-09-C-7924 (Defense Advanced Research Projects Agency (DARPA)). The Government has certain rights in this invention.

BACKGROUND

1. Technical Field

The present invention relates generally to information processing and, in particular, to a fully decoupled LC tank based oscillator topology for low phase noise and high oscillation amplitude applications.

2. Description of the Related Art

Oscillator phase noise is a key performance metric in many wireless and wireline communication applications, radars, sensors, imagers, data converters, and so forth. Any clocked system performance would benefit from a lower noise oscillator. One way to lower oscillator phase noise is to increase the amplitude of oscillation. Within a given technology, the maximum amplitude is determined by the breakdown of the active devices (FETs, BJTs or other types of devices). Oscillator phase noise can also be lowered by using lower noise devices or higher breakdown devices, by lowering the temperature, and so forth.

A general expression for oscillator noise is given by Leeson's formula as follows:

$$L(\Delta\omega) = 10\log\left\{\frac{2FkT}{P_{sig}}\left(1 + \left(\frac{\omega_0}{2Q\Delta\omega}\right)^2\right)\right\}$$

From this equation we see that at a given temperature T, frequency of oscillation $\omega_0$, offset from the carrier $\Delta\omega$ and Q factor, the only way to decrease phase noise is to increase the signal power ($P_{sig}$) (or, equivalently, the amplitude of the oscillation), keeping the noise factor, F, constant. Here $k=1.3806503\times10^{-23}$ m$^2$ kg/s$^2$/K is the Boltzmann constant.

Within a given technology increasing the amplitude to noise ratio is the most direct practical approach to solving this fundamental problem. It is important to emphasize that in general a lower noise active device also has a lower breakdown voltage. Additionally, in virtually all technologies, the breakdown voltage of the active devices is much lower than the breakdown voltage of passive devices. Note also that the breakdown of some passive devices (such as Metal-Oxide-Metal capacitors) can be controlled to a certain extent by design.

SUMMARY

According to an aspect of the present principles, there is provided a tank based oscillator. The oscillator includes one or more active devices, one or more passive devices, and a tank circuit decoupled from the active devices using at least one of the one or more passive devices. A coupling ratio between the tank circuit and the one or more active devices is set such that a maximum value of an oscillation amplitude of the tank circuit is limited based upon a breakdown of only the one or more passive devices.

According to another aspect of the present principles, there is provided a method. The method includes providing a tank based oscillator having one or more active devices, one or more passive devices, and a tank circuit. The method further includes decoupling the tank circuit from the active devices using at least one of the one or more passive devices. A coupling ratio between the tank circuit and the one or more active devices is set such that a maximum value of an oscillation amplitude of the tank circuit is limited based upon a breakdown of only the one or more passive devices.

According to yet another aspect of the present principles, there is provided a tank based oscillator. The oscillator includes a tank circuit. The oscillator also includes at least a first and a second capacitor. The oscillator further includes a first and a second active device. Each of the first and the second active devices is an N-channel metal oxide field effect transistor or a bipolar junction transistor and has at least a drain or a collector and a gate or a base. The gate or base of the first active device is connected to a side of the first capacitor and the drain or collector of the second active device. The gate or base of the second active device is connected to a side of the second capacitor and the drain or collector of the first active device. The tank circuit is connected in between another side of the first capacitor and another side of the second capacitor to decouple the tank circuit from the first and second active devices.

According to still another aspect of the present principles, there is provided a tank based oscillator. The oscillator includes a tank circuit. The oscillator also includes at least a first, a second, a third, and a fourth capacitor. The oscillator further includes a first and a second active device. Each of the first and second active devices is an N-channel metal oxide field effect transistor or a bipolar junction transistor and has at least a drain or collector and a gate or a base. The gate or base of the first active device is connected to a side of the first capacitor and a side of the third capacitor. The gate or base of the second active device is connected to a side of the second capacitor and a side of the fourth capacitor. Another side of the first capacitor is connected to the drain or collector of the second active device. Another side of the second capacitor is connected to the drain or collector of the first active device. The tank circuit is connected in between another side of the third capacitor and another side of the fourth capacitor to decouple the tank circuit from the first and second active devices.

According to a further aspect of the present principles, there is provided a tank based oscillator. The oscillator includes a tank circuit. The oscillator also includes at least a first, a second, a third, a fourth capacitor, and a fifth capacitor. The oscillator further includes a first and a second active device. Each of the first and second active devices is an N-channel metal oxide field effect transistor or a bipolar junction transistor and having at least a drain or a collector and a gate or a base. The gate or base of the first active device is connected to a side of the first capacitor and a side of the fifth capacitor. The gate or base of the second active device is connected to a side of the second capacitor and another side of the fifth capacitor. Another side of the first capacitor is connected to the drain or collector of the second active device and a side of the fourth capacitor. Another side of the second capacitor is connected to the drain or collector of the first active device and a side of the third capacitor. The tank circuit is connected in between another side of the third capacitor and another side of the fourth capacitor to decouple the tank circuit from the first and second active devices.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to a fully decoupled inductor-capacitor (LC) tank based oscillator topology for low phase noise and high oscillation amplitude applications.

In accordance with an embodiment of the present principles, we propose a way to operate the oscillator such that the amplitude of the oscillation is not limited by the breakdown voltages of the active devices. Rather, the LC tank is decoupled from the active devices and the coupling ratio between the LC tank and the active devices is set so that the oscillation amplitude can reach the maximum value determined by the breakdown of the passive components only. For example, we envision a scenario where the oscillator safely achieves 40 V peak to peak differential amplitude using active devices with breakdown voltages of 1 V.

In accordance with an embodiment of the present principles, we expose the active devices in the oscillator to a small fraction of the full amplitude. This can be implemented with a capacitive divider, transformer or a similar passive decoupling device. An additional benefit of the proposed approach is the reduced amount of noise that is injected from the active devices into the tank. The overall phase noise is then lowered by both the increased amplitude and relatively lower noise injection.

We have examined a variety of circuit topologies which can achieve the goal of reducing phase noise through the general techniques of increased oscillation amplitude and reduced injection of active device noise into the tank. We will discuss and classify the topologies by the degree to which they achieve the following objectives, all of which are advantageous to achieving low phase noise: (1) increased oscillation amplitude in the oscillator LC tank; (2) reduced injection of active device noise into the LC tank; (3) improved tank Q (or reduced degradation of tank Q due to active device and bias circuit loading); (4) independent biasing of device drain and gate (or collector and base) for controlling oscillation amplitude and the region of device operation; and reduced waveform distortion. The benefits of (1)-(4) above follow directly from Leeson's formula.

Figure 1:
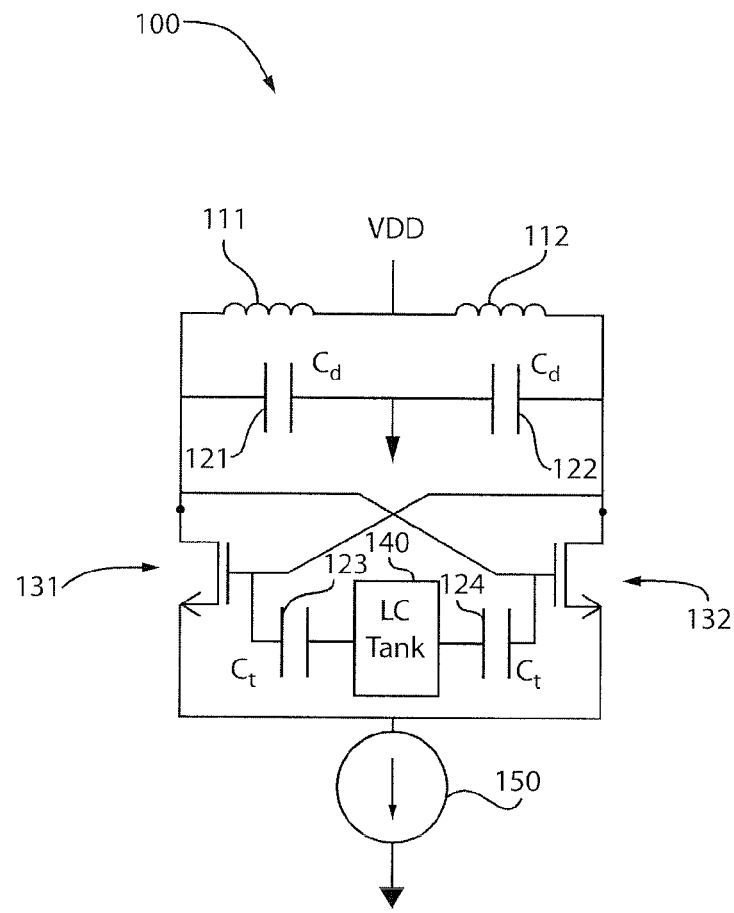
FIG. 1 shows an LC tank based oscillator topology 100, in accordance with an embodiment of the present principles.

FIG. 1 shows an LC tank based oscillator topology 100, in accordance with an embodiment of the present principles. The LC tank based oscillator topology 100 includes an inductor 111, an inductor 112, a capacitor $C_d$ 121, a capacitor $C_d$ 122, a capacitor $C_t$ 123, a capacitor $C_t$ 124, an active device 131, an active device 132, an LC tank 140, and a current source 150.

The gate (or base) of active device 131 is connected to a side of capacitor $C_t$ 124, the drain (or collector) of active device 132, a side of capacitor $C_d$ 121, and a side of inductor 111. The gate (or base) of active device 132 is connected to a side of capacitor $C_t$ 123, the drain (or collector) of active device 131, a side of capacitor $C_d$ 122, and a side of inductor 112. Another side of capacitor $C_d$ 121 is connected to another side of capacitor $C_d$ 122. Another side of inductor 111 is connected to another side of inductor 112 and to a voltage $V_{DD}$. The LC tank circuit 140 is connected in between another side of capacitor $C_t$ 124 and another side of capacitor $C_t$ 123 to decouple the LC tank circuit 140 from active devices 131 and 132. Sources (or emitters) of active devices 131 and 132 are connected to each other and to a current source 150.

In the example of FIG. 1, the active devices 131 and 132 are (n-channel) MOSFETS. However, given the teachings of the present principles provided herein, it is to be appreciated that one of ordinary skill in the art can readily implement the topology 100 of FIG. 1 with respect to other types of active devices, while maintaining the spirit of the present principles. Moreover, the same type of device may be used, e.g., a MOSFET, but using a p-channel version. These and other variations in the circuit elements of topology 100 are readily determined and implemented by one of ordinary skill in the art given the teachings of the present principles provided herein. In topology 100, the LC tank 140 is moved to a position between the gates of the devices 131 and 132, isolated by capacitors $C_t$.

Figure 2:
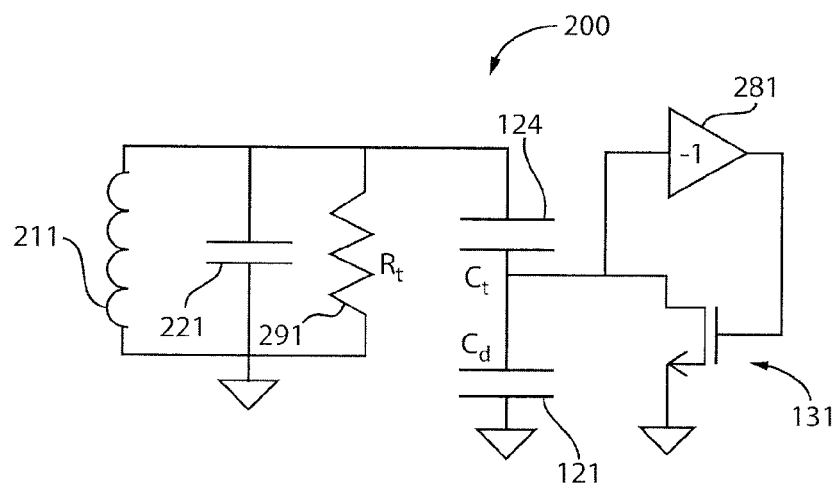
FIG. 2 shows the equivalent half-circuit 200 for topology 100, in accordance with an embodiment of the present principles.

FIG. 2 shows the equivalent half-circuit 200 for topology 100, in accordance with an embodiment of the present principles. The half circuit 200 includes an inductor 211, a capacitor 221, a resistor $R_t$ 291, capacitor $C_t$ 124, capacitor $C_d$ 121, active device 131, and an inverting device 281. The inductor 211, capacitor 221, and resistor $R_E$ 291 relate to LC tank 140. In particular, inductor 211 represents the inductance component of the LC tank 140, capacitor 221 represents the capacitance component of the LC tank 140, and $R_t$ 291 represents the losses in the LC tank 140. While elements from one half of topology 100 were used for the half-circuit 200, keeping the figure reference numerals corresponding thereto, one of ordinary skill in the art will readily appreciate that the values of the same elements will differ from the full circuit topology 100 versus the half circuit 200 but are nonetheless readily determined by one of ordinary skill in the art given the teachings of the present principles provided herein. Steady state is determined according to the following:

$$\frac{G_m \cdot V_g \cdot R_t}{n} = V_t = k \cdot V_g \Rightarrow \frac{G_m}{n \cdot k} = \frac{1}{R_t}.$$

It can be seen that the tank oscillation amplitude is divided onto the gates of the active devices 131 and 132 by ratio $C_d/(C_d+C_t)=1/k$. The tank is decoupled from the active devices 131 and 132, and the capacitive divider allows higher oscillation amplitude without chances of breakdown at the device gates. An additional benefit to topography 100 is that the drain current noise does not all flow through the tank 140. Rather, some of the drain current noise flows through the series combination of $C_t$ and $R_t$, and some through $C_d$. If we define $1/n$ to be the fraction of the drain current noise that flows into the tank, then $n \approx (Z_{Cd}+Z_{Ct}+R_t)/Z_{Cd} = (C_t+C_d+R_t \cdot sC_d \cdot C_t)/C_t$.

The capacitive divider in FIG. 1, formed from capacitors $C_t$ and $C_d$, reduces active device loading on the tank 140, therefore tank 140 Q is degraded less than in the case of a cross-coupled oscillator, and there is less waveform distortion.

Figure 3:
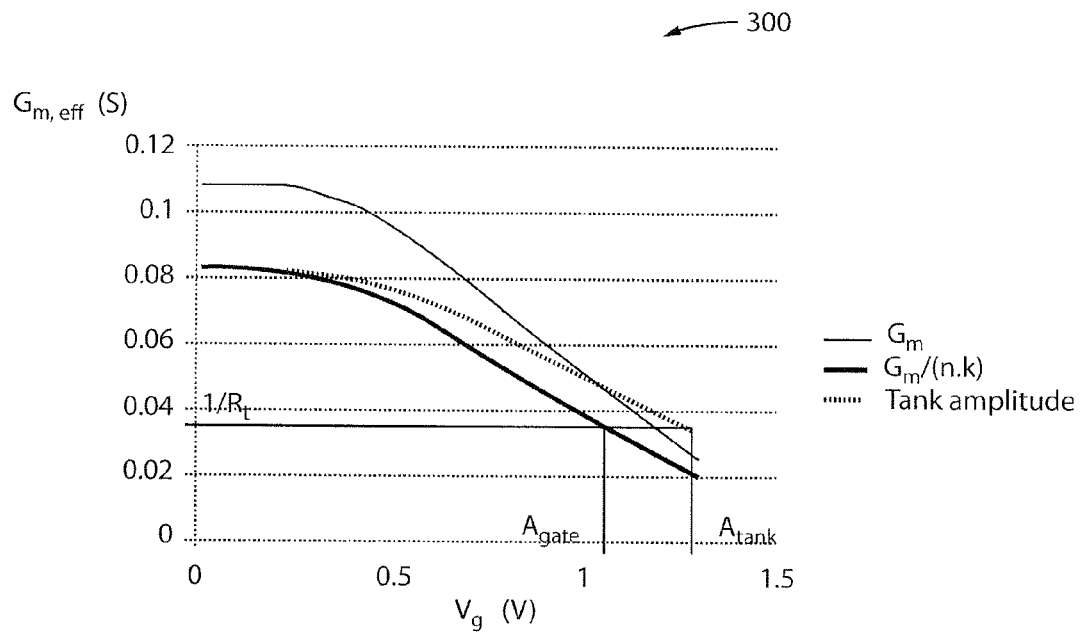
FIG. 3 shows a plot 300 for a simulation involving the steady-state oscillation amplitude (Atank), gate-voltage amplitude (Agate), and variation in Gm over the cycle for topology 100, in accordance with an embodiment of the present principles.

FIG. 3 shows a plot 300 for a simulation involving the steady-state oscillation amplitude (Atank), gate-voltage amplitude (Agate), and variation in Gm over the cycle for topology 100, in accordance with an embodiment of the present principles. The x-axis represents the amplitude swing on the transistor gates or tank, as applicable, and the y-axis represents the large signal transconductance. In the example of FIG. 3, k=1.1, and n=1.2.

Figure 4:
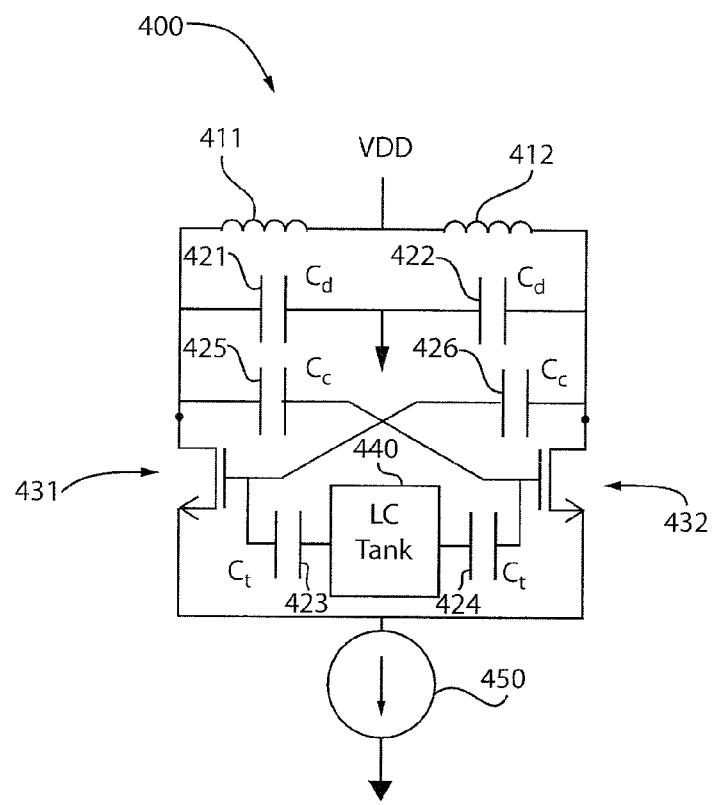
FIG. 4 shows another LC tank based oscillator topology 400, in accordance with an embodiment of the present principles.

FIG. 4 shows another LC tank based oscillator topology 400, in accordance with an embodiment of the present principles. The LC tank based oscillator topology 400 includes an inductor 411, an inductor 412, a capacitor $C_d$ 421, a capacitor $C_d$ 422, a capacitor $C_t$ 423, a capacitor $C_t$ 424, a capacitor $C_c$ 425, a capacitor $C_c$ 426, an active device 431, an active device 432, an LC tank 440, and a current source 450.

The gate (or base) of active device 431 is connected to a side of capacitor $C_c$ 426 and a side of capacitor $C_t$ 423. The gate (or base) of active device 432 is connected to a side of capacitor $C_c$ 425 and a side of capacitor $C_t$ 425. Another side of capacitor $C_c$ 426 is connected to the drain (or collector) of active device 432, a side of capacitor $C_d$ 422 and a side of inductor 412. Another side of capacitor $C_c$ 425 is connected to the drain (or collector) of active device 431, a side of capacitor $C_d$ 421, and a side of inductor 411. Another side of capacitor $C_d$ 421 is connected to another side of capacitor $C_d$ 422. Another side of inductor 411 is connected to another side of inductor 412 and a voltage $V_{DD}$. The LC tank circuit 440 is connected in between another side of capacitor $C_t$ 423 and another side of capacitor $C_t$ 424 to decouple the LC tank circuit 440 from active devices 431 and 432. Sources (or emitters) of active devices 431 and 432 are connected to each other and to a current source 450.

In the example of FIG. 4, the active devices 431 and 432 are (n-channel) MOSFETS. However, given the teachings of the present principles provided herein, it is to be appreciated that one of ordinary skill in the art can readily implement the topology 400 of FIG. 4 with respect to other types of active devices, while maintaining the spirit of the present principles. Moreover, the same type of device may be used, e.g., a MOS-FET, but using a p-channel version. These and other variations in the circuit elements of topology 400 are readily determined and implemented by one of ordinary skill in the art given the teachings of the present principles provided herein. Topology 400 decouples the LC tank 440 from the active device terminals, providing a way to increase oscillation amplitude above the device breakdown limits at both gate (or base) and drain (or collector), while also reducing the effects of device non-linearity at both gate and drain.

Figure 5:
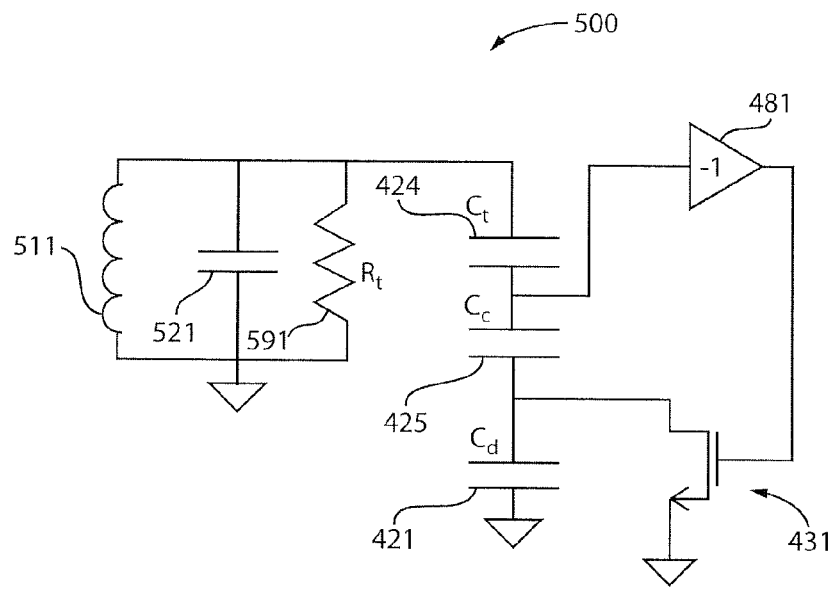
FIG. 5 shows the equivalent half-circuit 500 for topology 400, in accordance with an embodiment of the present principles.

FIG. 5 shows the equivalent half-circuit 500 for topology 400, in accordance with an embodiment of the present principles. The half circuit 500 includes an inductor 511, a capacitor 521, a resistor $R_t$ 591, capacitor $C_c$ 425, capacitor $C_d$ 421, capacitor $C_t$ 424, active device 431, and an inverting device 481. The inductor 511, capacitor 521, and resistor $R_t$ 591 relate to LC tank 440. In particular, inductor 511 represents the inductance component of the LC tank 440, capacitor 521 represents the capacitance component of the LC tank 440, and $R_t$ 591 represents the losses in the LC tank 440. While elements from one half of topology 400 were used for the half-circuit 500, keeping the figure reference numerals corresponding thereto, one of ordinary skill in the art will readily appreciate that the values of the same elements will differ from the full circuit topology 400 versus the half circuit 500 but are nonetheless readily determined by one of ordinary skill in the art given the teachings of the present principles provided herein. Once again, $1/n$ represents the fraction of drain current noise that flows into the tank, and $1/k$ represents the voltage division ratio from the tank to the device gates, where $n \approx (Z_{Cc}+Z_{Ct}+R_t+Z_{Cd})/Z_{Cd} = (C_tC_d+C_dC_c+sR_tC_dC_cC_t+C_tC_c)/C_tC_c$ and $k \approx (C_t+C_k)/C_t$ where $C_k = C_cC_d/(C_c+C_d)$. Steady state is determined according to the following:

$$\frac{G_m \cdot V_g \cdot R_t}{n} = V_t = k \cdot V_g \Rightarrow \frac{G_m}{n \cdot k} = \frac{1}{R_t}.$$

Topology 400 provides an increase in the oscillation amplitude using two different techniques. The capacitor feedback ensures that even though the inherent device transconductance non-linearity limits the oscillation amplitude on the gate/base, the amplitude on the tank 440 is larger than this limitation by a factor of k. Additionally, the device non-linearity is reduced, which increases the amplitude of oscillation even on the gate/base for a given amount of injected active device noise. Moreover, by completely decoupling the tank 440 from the active devices 431 and 432, the oscillation amplitude is not limited by the breakdown of these devices 431 and 432.

To summarize, the advantages of topology 400 are as follows: (1) the amplitude of oscillation is increased by the tank to gate (base) feedback-ratio, k; (2) the amplitude is also increased from Agate to Atank as a result of $G_m$ linearization from a lower drain voltage swing as shown in FIG. 3; (3) the tank is completely decoupled from the active devices, and can therefore sustain much larger voltage swings; (4) only a fraction of the active device noise is injected into the tank; (5) only a fraction of the noise from the biasing circuitry flows into the tank; and (6) the tank Q is not degraded by the MOSFETs entering the triode region of operation, causing lower distortion, and improving the phase noise. Advantages (2) and (6) are less dominant in full BJT versions of this topology 400 versus MOSFET versions.

Figure 6:
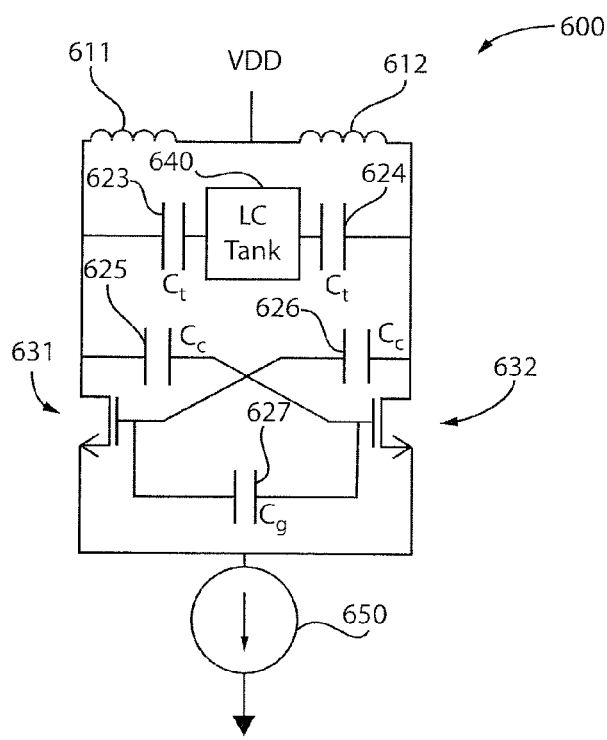
FIG. 6 shows yet another LC tank based oscillator topology 600, in accordance with an embodiment of the present principles.

FIG. 6 shows yet another LC tank based oscillator topology 600, in accordance with an embodiment of the present principles. The LC tank based oscillator topology 600 includes an inductor 611, an inductor 612, a capacitor $C_t$ 623, a capacitor $C_t$ 624, a capacitor $C_c$ 625, a capacitor $C_c$ 626, a capacitor $C_g$ 627, an active device 631, an active device 632, an LC tank 640, and a current source 650.

The gate (or base) of active device 631 is connected to a side of capacitor $C_c$ 626 and a side of capacitor $C_g$ 627. The gate (or base) of active device 632 is connected to a side of capacitor $C_c$ 625 and another side of capacitor $C_g$ 627. Another side of capacitor $C_c$ 626 is connected to the drain (or collector) of active device 631, a side of capacitor $C_t$ 624, and a side of inductor 612. Another side of capacitor $C_c$ 625 is connected to the drain (or collector) of active device 631, a side of capacitor $C_t$ 623, and a side of inductor 611. Another side of inductor 611 is connected to another side of inductor 612 and a voltage $V_{DD}$. The LC tank circuit 640 is connected in between another side of capacitor $C_t$ 623 and another side of capacitor $C_t$ 624 to decouple the LC tank circuit 640 from active devices 631 and 632. Sources (or emitters) of active devices 631 and 632 are connected to each other and to a current source 650.

In the example of FIG. 6, the active devices 631 and 632 are (n-channel) MOSFETS. However, given the teachings of the present principles provided herein, it is to be appreciated that one of ordinary skill in the art can readily implement the topology 600 of FIG. 6 with respect to other types of active devices, while maintaining the spirit of the present principles. Moreover, the same type of device may be used, e.g., a MOSFET, but using a p-channel version. These and other variations in the circuit elements of topology 600 are readily determined and implemented by one of ordinary skill in the art given the teachings of the present principles provided herein. The topology 600 moves the LC tank 640 to a location between the device drains, isolated by capacitors $C_t$.

Figure 7:
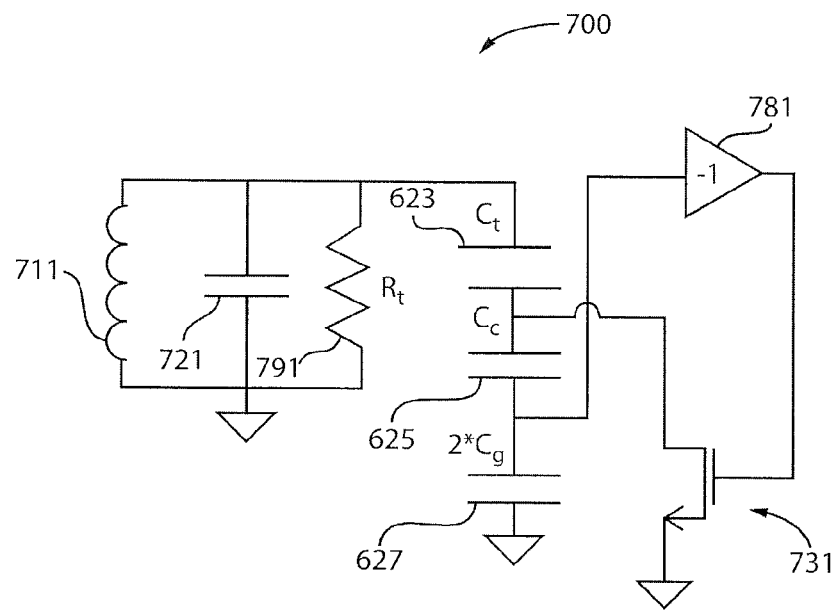
FIG. 7 shows the equivalent half-circuit 700 for topology 600, in accordance with an embodiment of the present principles.

FIG. 7 shows the equivalent half-circuit 700 for topology 600, in accordance with an embodiment of the present principles. The half circuit 700 includes an inductor 711, a capacitor 721, a resistor $R_t$ 791, capacitor $C_c$ 625, capacitor $2*C_g$ 627, capacitor $C_t$ 623, active device 631, and an inverting device 781. The inductor 711, capacitor 721, and resistor $R_t$ 791 relate to LC tank 640. In particular, inductor 711 represents the inductance component of the LC tank 640, capacitor 721 represents the capacitance component of the LC tank 640, and $R_t$ 791 represents the losses in the LC tank 640. While elements from one half of topology 600 were used for the half-circuit 700, keeping the figure reference numerals corresponding thereto, one of ordinary skill in the art will readily appreciate that the values of the same elements will differ from the full circuit topology 600 versus the half circuit 700 but are nonetheless readily determined by one of ordinary skill in the art given the teachings of the present principles provided herein. By comparison with half-circuit 500, half-circuit 700 clearly shows that the voltage division ratio from the tank 640 to the device gates is increased as compared to tank 440.

That is, the fraction of the tank voltage on the device gates is lower (by 1/k), where $k \approx (C_t + C_d)/C_l$ where $C_l = C_c C_t/(C_c + C_t)$. Conversely, the fraction of the tank voltage on the device drains is higher than in FIG. 5, and is given as $(C_t + C_k)/C_t$ where $C_k = C_c C_d/(C_c + C_d)$. Thus, topology 600 provides more $G_m$ linearization than topology 400 since the swing on the drain is relatively lower causing lower non-linearity. However, the feedback ratio to the gate is relatively larger for topology 600 as compared to topology 400, therefore increasing the amplitude on the tank as a result of this feedback ratio. Therefore, these two topologies 600 and 400 provide a way to trade off between the two techniques for amplitude increase depending on the device characteristics, and the requirements for a particular design.

For example, in practical implementations, since the MOSFET non-linearity is highly dependent on the drain voltage swing, topology 400 with its lower voltage swing is suitable for MOSFET implementations. On the other hand, considering BJT versions of the same topology 400, the collector voltage swing does not affect the BJT non-linearity as significantly as the swing on the highly non-linear base voltage node. Therefore, the amplitude increase from the large tank-to-gate feedback (k) ratio in topology 600 makes topology 600 particularly suitable for BJT versions.

Figure 8:
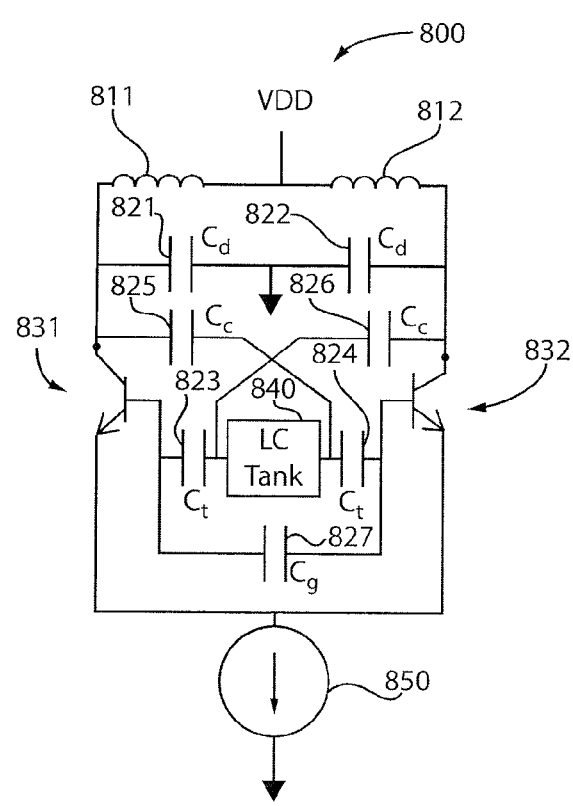
FIG. 8 shows still another LC tank based oscillator topology 800, in accordance with an embodiment of the present principles.

FIG. 8 shows still another LC tank based oscillator topology 800, in accordance with an embodiment of the present principles. The LC tank based oscillator topology 800 includes an inductor 811, an inductor 812, a capacitor Cd 821, a capacitor $C_d$ 822, a capacitor $C_t$ 823, a capacitor $C_t$ 824, a capacitor $C_c$ 825, a capacitor $C_c$ 826, a capacitor $C_g$ 827, an active device 831, an active device 832, an LC tank 840, and a current source 850.

The gate (or base) of active device 831 is connected to a side of capacitor $C_t$ 823 and a side of capacitor $C_g$ 827. The gate (or base) of active device 832 is connected to a side of capacitor $C_t$ 824 and another side of capacitor $C_g$ 827. A side of capacitor $C_c$ 825 is connected to the drain (or collector) of active device 831, a side of capacitor 821 $C_d$, and a side of inductor 811. A side of capacitor $C_c$ 826 is connected to the drain (or collector) of active device 832, a side of capacitor $C_d$ 822, and a side of inductor 812. Another side of inductor 811 is connected to another side of inductor 812 and a voltage $V_{DD}$. Another side of capacitor $C_t$ 823 is connected to another side of capacitor $C_c$ 826 and a side of the LC tank circuit 840. Another side of capacitor $C_t$ 824 is connected to another side of capacitor $C_c$ 825 and another side of the LC tank circuit 840 to decouple the LC tank circuit 840 from active devices 831 and 832. Sources (or emitters) of active devices 831 and 832 are connected to each other and to a current source 850.

For exemplary purposes, the active devices 831 and 832 are shown as bipolar transistors. However, it is to be appreciated that topology 800 can readily use MOSFETS in place of the transistors, while maintaining the spirit of the present principles. These and other variations in the circuit elements of topology 800 are readily determined and implemented by one of ordinary skill in the art given the teachings of the present principles provided herein.

Figure 9:
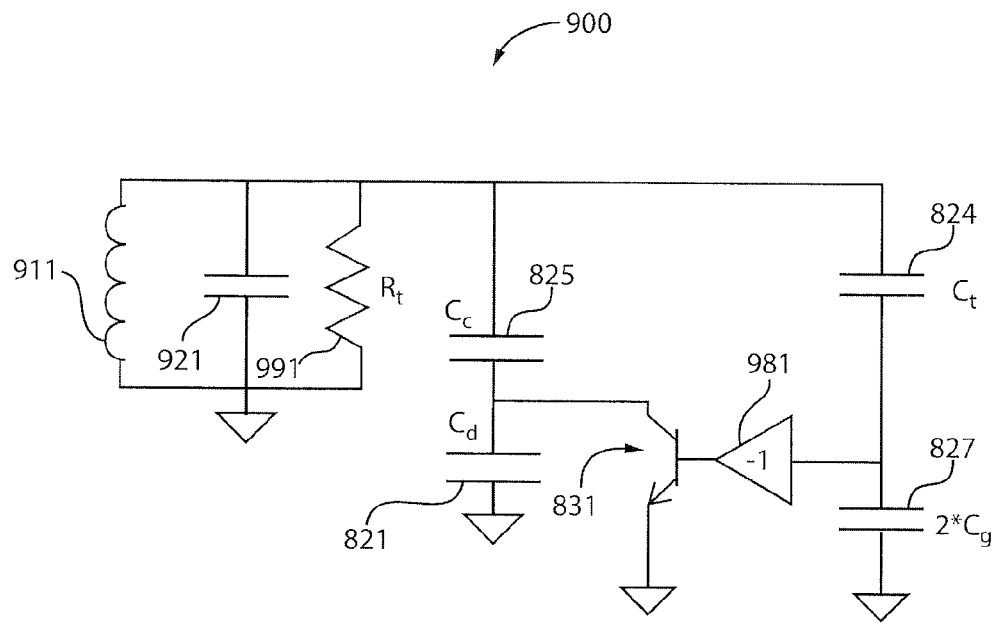
FIG. 9 shows the equivalent half-circuit 900 for topology 800, in accordance with an embodiment of the present principles.

FIG. 9 shows the equivalent half-circuit 900 for topology 800, in accordance with an embodiment of the present principles. The half circuit 900 includes an inductor 911, a capacitor 921, a resistor $R_t$ 991, capacitor $C_c$ 825, capacitor $C_d$ 821, capacitor $C_t$ 824, capacitor $2*C_g$ 827, active device 831, and an inverting device 981. The inductor 911, capacitor 921, and resistor R, 991 relate to LC tank 840. In particular, inductor 911 represents the inductance component of the LC tank 840, capacitor 921 represents the capacitance component of the LC tank 840, and $R_t$ 991 represents the losses in the LC tank 840. While elements from one half of topology 800 were used for the half-circuit 900, keeping the figure reference numerals corresponding thereto, one of ordinary skill in the art will readily appreciate that the values of the same elements will differ from the full circuit topology 800 versus the half circuit 900 but are nonetheless readily determined by one of ordinary skill in the art given the teachings of the present principles provided herein.

Topology 800 shares the same advantages as topology 400 as mentioned above. Additionally, this topology 800 offers an extra degree of freedom for the choice of variables, and therefore provides more control over the performance specifications for this design. That is, compared to topology 400, topology 800 adds an additional capacitor (compare FIG. 9 with FIG. 5), which now provides freedom in choosing the total capacitive load, bias tuning, and feedback ratios (that is, there are 4 capacitors and 4 specifications). This is particularly useful in bipolar implementations where smaller base voltage swing is desired, due to higher device transconductance and greater non-linearity in the base-emitter circuit.

Figure 10:
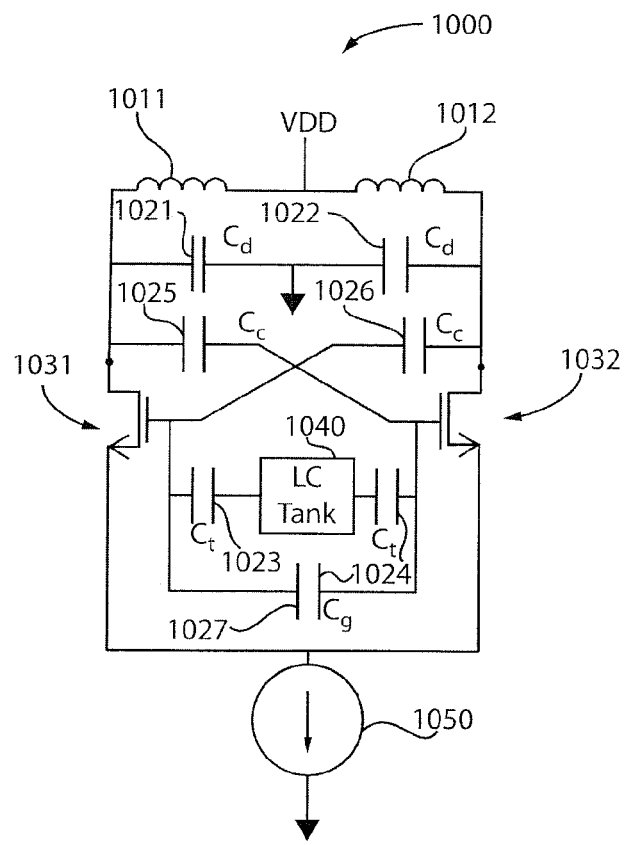
FIG. 10 shows still yet another LC tank based oscillator topology 1000, in accordance with an embodiment of the present principles.

FIG. 10 shows still yet another LC tank based oscillator topology 1000, in accordance with an embodiment of the present principles. The LC tank based oscillator topology 1000 includes an inductor 1011, an inductor 1012, a capacitor $C_d$ 1021, a capacitor $C_d$ 1022, a capacitor $C_t$ 1023, a capacitor $C_t$ 1024, a capacitor $C_c$ 1025, a capacitor $C_c$ 1026, a capacitor $C_g$ 1027, an active device 1031, an active device 1032, an LC tank 1040, and a current source 1050.

The gate (or base) of active device 1031 is connected to a side of capacitor $C_c$ 1026, a side of capacitor $C_t$ 1023, and a side of capacitor $C_g$ 1027. The gate (or base) of active device 1032 is connected to a side of capacitor $C_c$ 1025, a side of capacitor $C_t$ 1024, and another side of capacitor $C_g$ 1027. Another side of capacitor $C_c$ 1026 is connected to the drain (or collector) of active device 1032, a side of capacitor $C_d$ 1022, and a side of an inductor 1012. Another side of capacitor $C_c$ 1025 is connected to the drain (or collector) of active device 1031, a side of capacitor $C_d$ 1021, and a side of inductor 1011. Another side of inductor 1011 is connected to another side of inductor 1012 and a voltage $V_{DD}$. The LC tank circuit 1040 is connected in between another side of capacitor $C_t$ 1023 and another side of capacitor $C_t$ 1024 to decouple the LC tank circuit 1040 from active devices 1031 and 1032. Sources (or emitters) of active devices 1031 and 1032 are connected to each other and to a current source 1050.

In the example of FIG. 10, the active devices 1031 and 1032 are (n-channel) MOSFETS. However, given the teachings of the present principles provided herein, it is to be appreciated that one of ordinary skill in the art can readily implement the topology 1000 of FIG. 10 with respect to other types of active devices, while maintaining the spirit of the present principles. Moreover, the same type of device may be used, e.g., a MOSFET, but using a p-channel version. These and other variations in the circuit elements of topology 1000 are readily determined and implemented by one of ordinary skill in the art given the teachings of the present principles provided herein.

Figure 11:
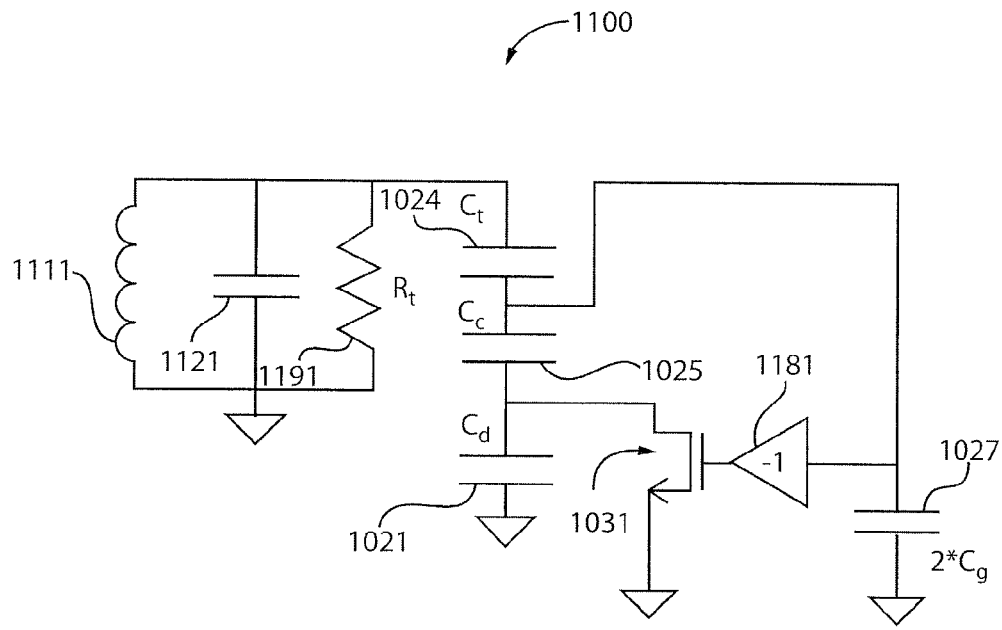
FIG. 11 shows the equivalent half-circuit 1100 for topology 1000, in accordance with an embodiment of the present principles.

FIG. 11 shows the equivalent half-circuit 1100 for topology 1000, in accordance with an embodiment of the present principles. The half circuit 1100 includes an inductor 1111, a capacitor 1121, a resistor $R_t$ 1191, capacitor $C_c$ 1025, capacitor $C_d$ 1021, capacitor $C_t$ 1024, capacitor $2*C_g$ 1027, active device 1031, and an inverting device 1181. The inductor 1111, capacitor 1121, and resistor $R_t$ 1191 relate to LC tank 1040. In particular, inductor 1111 represents the inductance component of the LC tank 1040, capacitor 1121 represents the capacitance component of the LC tank 1040, and $R_t$ 1191 represents the losses in the LC tank 1040. While elements from one half of topology 1000 were used for the half-circuit 1100, keeping the figure reference numerals corresponding thereto, one of ordinary skill in the art will readily appreciate that the values of the same elements will differ from the full circuit topology 1000 versus the half circuit 1100 but are nonetheless readily determined by one of ordinary skill in the art given the teachings of the present principles provided herein.

Referring to equivalent half-circuit 1100, it can be seen that topology 1000 also has 4 capacitors and thus gives complete flexibility in choosing total capacitive load, bias tuning, and feedback ratios. In fact, topology 800 and topology 1000 are equivalent in the sense that one circuit can be transformed into the other, with only a change in the value of the capacitors $C_c$, $C_d$, $C_t$, and $C_g$. Which circuit would be preferred would depend on which one gave more convenient and easily realizable capacitor values for a given application.

In all of the equivalent half-circuits discussed thus far (i.e., FIGS. 2, 5, 7, 9, and 11), the biasing inductors between Vdd and the device drains have been assumed to be very high impedance and omitted to simplify the analysis. However, detailed simulations indicate the resonant frequency in the drain circuit is important, affecting oscillation amplitude and phase noise. The oscillation frequency is primarily determined by the LC Tank resonant frequency, but the oscillation amplitude is highest and phase noise lowest if the drain circuit resonant frequency can be tuned to a frequency just below the oscillation frequency. The optimum drain circuit resonant frequency is empirically observed to be about 70-90% of the oscillation frequency. For that reason, it is advantageous to make provision to tune both the LC Tank resonant frequency and the drain circuit resonant frequency in tandem.

TABLE 1 shows a summary of topologies and corresponding advantages, in accordance with an embodiment of the present principles. That is, TABLE 1 summarizes the different voltage controlled oscillator (VCO) topologies that were previously discussed and compares their advantages (and disadvantages). The four aspects compared include the amplitude of oscillation (A), the noise injected into the tank (N), the loaded quality factor of the tank due to the impact of the transconductor (Q), and the waveform distortion due to varying resistance in the loaded tank (D). These aspects have a direct impact on the phase noise performance of the VCO. The mechanisms for improvement/alteration in these parameters for the different VCOs are mentioned in parentheses. Additional comments regarding the topologies have also been emphasized in the "Comment" column. As can be seen from TABLE 1, our proposed architectures improve these aspects (A, N Q and D) of the VCO as compared to prior art cross-coupled topologies. As a consequence, the new topologies provide different mechanisms to achieve a low phase noise performance. TABLE 1 also provides an intuition of the trade-offs between these topologies. The choice of a particular topology can be determined by the specific requirements for that design.

TABLE 1

| Topology | Advantages | FIGS. | Comment |
|---|---|---|---|
| 100 | A→ Increased (feedback), no breakdown issues<br>N→ Fraction of active, fraction from bias<br>Q→ Degraded (less than X-coupled)<br>D→ Lower distortion than X-coupled | 1, 2 | The biasing network can be tuned close to the oscillation frequency to improve the phase noise |
| 400 | A→ Increased (feedback, gm lim.), no breakdown issues<br>N→ Fraction of active, fraction of bias<br>Q→ Not degraded<br>D→ Minimal distortion | 4, 5 | Emphasis on gm linearization<br>The biasing network can be tuned close to the oscillation frequency to improve phase noise |
| 600 | A→ Increased (feedback, gm lim.), no breakdown issues<br>N→ Fraction of active, fraction of bias<br>Q→ Not degraded | 6, 7 | Emphasis on amplitude increase from feedback ratio<br>The biasing network can be tuned close to the |

TABLE 1-continued

| Topology | Advantages | FIGS. | Comment |
|---|---|---|---|
| | D→ Minimal distortion | | oscillation frequency to improve phase noise |
| 800 | A→ Increased (feedback, gm lim.), no breakdown issues<br>N→ Fraction of active, fraction from bias<br>Q→ Not degraded<br>D→ Minimal distortion | 8, 9 | Complete freedom of choosing all parameters<br>The biasing network can be tuned close to the oscillation frequency to improve phase noise |
| 1000 | A→ Increased (feedback, gm lim.), no breakdown issues<br>N→ Fraction of active, fraction from bias<br>Q→ Not degraded<br>D→ Minimal distortion | 10, 11 | Different cap values from topology 800 (potentially easier implementation depending on design)<br>Complete freedom in choosing all parameters<br>The biasing network can be tuned close to the oscillation frequency to improve phase noise |

Figure 12:
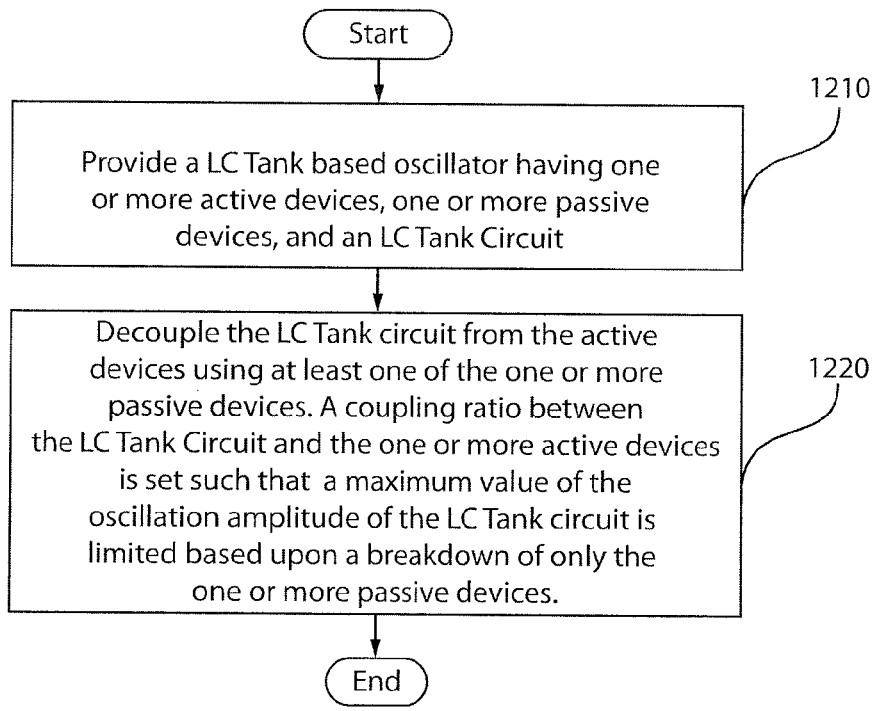
FIG. 12 is a method 1200 for decoupling an LC tank based oscillator, in accordance with an embodiment of the present principles.

FIG. 12 is a method 1200 for decoupling an LC tank based oscillator, in accordance with an embodiment of the present principles. The decoupling is particularly advantageous for low phase noise and high oscillation amplitude applications.

At step 1210, an LC tank based oscillator is provided having one or more active devices, one or more passive devices, and an LC tank circuit. At step 1220, the LC tank circuit is decoupled from the active devices using at least one of the one or more passive devices. Regarding step 1220, a coupling ratio between the LC tank circuit and the one or more active devices is set such that a maximum value of the oscillation amplitude of the LC tank circuit is limited based upon a breakdown of only the one or more passive devices.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A tank based oscillator, comprising:
   one or more active devices;
   one or more passive devices; and
   a tank circuit direct current decoupled from all of the active devices using at least one of the one or more passive devices,
   wherein an alternating current coupling ratio between the tank circuit and gates or bases of the one or more active devices is set such that a maximum value of an oscillation amplitude of the tank circuit is limited based upon a breakdown of only the one or more passive devices.

2. The tank based oscillator of claim 1, wherein the one or more active devices are exposed to only a fraction of the maximum value of the oscillation amplitude.

3. The tank based oscillator of claim 1, wherein the maximum value of the oscillation amplitude is determined based on at least one of a breakdown voltage and a breakdown current of at least one of the one or more passive devices.

4. The tank based oscillator of claim 1, wherein the one or more active devices comprise at least a first and a second active device, the one or more passive devices comprise at least a first and a second passive device, a side of the first passive device is connected to a side of the tank circuit, a side of the second passive device is connected to another side of the tank circuit, another side of the first passive device is connected to a base or a drain of the first active device, and another side of the second passive device is connected to a base or a drain of the second active device.

5. The tank based oscillator of claim 1, wherein the one or more active devices comprise one or more MOSFETs or one or more bipolar junction transistors.

6. The tank based oscillator of claim 5, wherein a drain and a gate of the one or more MOSFETS are independently biased to control the oscillation amplitude of the tank circuit.

7. The tank based oscillator of claim 5, wherein a collector and a base of the one or more bipolar junction transistors are independently biased to control the oscillation amplitude of the tank circuit.

8. The tank based oscillator of claim 1, wherein the one or more passive devices comprise at least a first and a second capacitor, the one or more active devices being N-channel metal oxide field effect transistors or bipolar junction transistors comprising a first and a second active device, each having at least a drain or a collector and a gate or a base, and wherein the gate or base of the first active device is connected to a side of the first capacitor and the drain or collector of the second active device, the gate or base of the second active device is connected to a side of the second capacitor and the drain or collector of the first active device, and the tank circuit is connected in between another side of the first capacitor and another side of the second capacitor to direct current decouple the tank circuit from the first and second active devices.

9. The tank based oscillator of claim 1, wherein the one or more passive devices comprise at least a first, a second, a third, and a fourth capacitor, the one or more active devices are N-channel metal oxide field effect transistors or bipolar junction transistors comprising a first and a second active device, each having at least a drain or a collector and a gate or a base, and wherein the gate or base of the first active device is connected to a side of the first capacitor and a side of the third capacitor, the gate or base of the second active device is connected to a side of the second capacitor and a side of the fourth capacitor, another side of the first capacitor is connected to the drain or collector of the second active device, another side of the second capacitor is connected to the drain or collector of the first active device, and the tank circuit is connected in between another side of the third capacitor and another side of the fourth capacitor to direct current decouple the tank circuit from the first and second active devices.

10. The tank based oscillator of claim 1, wherein the one or more passive devices comprise at least a first, a second, a third, a fourth capacitor, and a fifth capacitor, the one or more active devices are N-channel metal oxide field effect transistors or bipolar junction transistors comprising a first and a second active device, each having at least a drain or a collector and a gate or a base, and wherein the gate or base of the first active device is connected to a side of the first capacitor and a side of the fifth capacitor, the gate or base of the second active device is connected to a side of the second capacitor and another side of the fifth capacitor, another side of the first capacitor is connected to the drain or collector of the second active device and a side of the fourth capacitor, another side of the second capacitor is connected to the drain or collector of the first active device and a side of the third capacitor, and the tank circuit is connected in between another side of the third capacitor and another side of the fourth capacitor to direct current decouple the tank circuit from the first and second active devices.

11. The tank based oscillator of claim 1, wherein the one or more passive devices comprise at least a first, a second, a third, a fourth capacitor, and a fifth capacitor, the one or more active devices are N-channel metal oxide field effect transistors or bipolar junction transistors comprising a first and a second active device, each having at least a drain or a collector and a gate or a base, and wherein the gate or base of the first active device is connected to a side of the first capacitor and a side of the fifth capacitor, the gate or base of the second active device is connected to a side of the second capacitor and another side of the fifth capacitor, a side of the fourth capacitor is connected to the drain or collector of the first active device, a side of the third capacitor is connected to the drain or collector of the second active device, another side of the first capacitor is connected to another side of the third capacitor and a side of the tank circuit, another side of the second capacitor is connected to another side of the fourth capacitor and another side of the tank circuit to direct current decouple the tank circuit from the first and second active devices.

12. The tank based oscillator of claim 1, wherein the one or more passive devices comprise at least a first, a second, a third, a fourth capacitor, and a fifth capacitor, the one or more active devices are N-channel metal oxide field effect transistors or bipolar junction transistors comprising a first and a second active device, each having at least a drain or a collector and a gate or a base, and wherein the gate or base of the first active device is connected to a side of the first capacitor, a side of the third capacitor, and a side of the fifth capacitor, the gate or base of the second active device is connected to a side of the second capacitor, a side of the fourth capacitor, and another side of the fifth capacitor, another side of the first capacitor is connected to the drain or collector of the second active device, another side of the second capacitor is connected to the drain or collector of the first active device, and the tank circuit is connected in between another side of the third capacitor and another side of the fourth capacitor to direct current decouple the tank circuit from the first and second active devices.

13. The tank based oscillator of claim 1, wherein the one or more passive devices comprise at least a first and a second capacitor, the one or more active devices are P-channel metal oxide field effect transistors or bipolar junction transistors comprising a first and a second active device, each having at least a source or an emitter and a gate or a base, and wherein the gate or base of the first active device is connected to a side of the first capacitor and the source or emitter of the second active device, the gate or base of the second active device is connected to a side of the second capacitor and the source or emitter of the first active device, and the tank circuit is connected in between another side of the first capacitor and another side of the second capacitor to direct current decouple the tank circuit from the first and second active devices.

14. The tank based oscillator of claim 1, wherein the one or more passive devices comprise at least a first, a second, a third, and a fourth capacitor, the one or more active devices are P-channel metal oxide field effect transistors or bipolar junction transistors comprising a first and a second active device, each having at least a source or an emitter and a gate or a base, and wherein the gate or base of the first active device is connected to a side of the first capacitor and a side of the third capacitor, the gate or base of the second active device is connected to a side of the second capacitor and a side of the fourth capacitor, another side of the first capacitor is connected to the source or emitter of the second active device, another side of the second capacitor is connected to the source or emitter of the first active device, and the tank circuit is connected in between another side of the third capacitor and another side of the fourth capacitor to direct current decouple the tank circuit from the first and second active devices.

15. The tank based oscillator of claim 1, wherein the one or more passive devices comprise at least a first, a second, a third, a fourth capacitor, and a fifth capacitor, the one or more active devices are P-channel metal oxide field effect transistors or bipolar junction transistors comprising a first and a second active device, each having at least a source or an emitter and a gate or a base, and wherein the gate or base of the first active device is connected to a side of the first capacitor and a side of the fifth capacitor, the gate or base of the second active device is connected to a side of the second capacitor and another side of the fifth capacitor, another side of the first capacitor is connected to the source or emitter of the second active device and a side of the fourth capacitor, another side of the second capacitor is connected to the source or emitter of the first active device and a side of the third capacitor, and the tank circuit is connected in between another side of the third capacitor and another side of the fourth capacitor to direct current decouple the tank circuit from the first and second active devices.

16. The tank based oscillator of claim 1, wherein the one or more passive devices comprise at least a first, a second, a third, a fourth capacitor, and a fifth capacitor, the one or more active devices are P-channel metal oxide field effect transistors or bipolar junction transistors comprising a first and a second active device, each having at least a source or an emitter and a gate or a base, and wherein the gate or base of the first active device is connected to a side of the first capacitor and a side of the fifth capacitor, the gate or base of the second active device is connected to a side of the second capacitor and another side of the fifth capacitor, a side of the fourth capacitor is connected to the source or emitter of the first active device, a side of the third capacitor is connected to the source or emitter of the second active device, another side of the first capacitor is connected to another side of the third capacitor and a side of the tank circuit, another side of the second capacitor is connected to another side of the fourth capacitor and another side of the tank circuit to direct current decouple the tank circuit from the first and second active devices.

17. The tank based oscillator of claim 1, wherein the one or more passive devices comprise at least a first, a second, a third, a fourth capacitor, and a fifth capacitor, the one or more active devices are P-channel metal oxide field effect transistors or bipolar junction transistors comprising a first and a second active device, each having at least a source or an emitter and a gate or a base, and wherein the gate or base of the first active device is connected to a side of the first capacitor, a side of the third capacitor, and a side of the fifth capacitor, the gate or base of the second active device is connected to a side of the second capacitor, a side of the fourth capacitor, and another side of the fifth capacitor, another side of the first capacitor is connected to the source or emitter of the second active device, another side of the second capacitor is connected to the source or emitter of the first active device, and the tank circuit is connected in between another side of the third capacitor and another side of the fourth capacitor to direct current decouple the tank circuit from the first and second active devices.

18. A method, comprising:
providing a tank based oscillator having one or more active devices, one or more passive devices, and a tank circuit; and
direct current decoupling the tank circuit from all of the active devices using at least one of the one or more passive devices; and
wherein an alternating current coupling ratio between the tank circuit and gates or bases of the one or more active devices is set such that a maximum value of an oscillation amplitude of the tank circuit is limited based upon a breakdown of only the one or more passive devices.

19. The method of claim 18, further comprising exposing the one or more active devices to only a fraction of the maximum value of the oscillation amplitude.

20. The method of claim 18, further comprising determining the maximum value of the oscillation amplitude based on at least one of a breakdown voltage and a breakdown current of at least one of the one or more passive devices.

21. The method of claim 18, wherein the one or more active devices comprise one or more MOSFETs, and the method further comprises independently biasing a drain and a gate of the one or more MOSFETS to control the oscillation amplitude of the tank circuit.

22. The method of claim 18, wherein the one or more active devices comprise one or more bipolar junction transistors, and the method further comprises independently biasing a collector and a base of the one or more bipolar junction transistors to control the oscillation amplitude of the tank circuit.

23. A tank based oscillator, comprising:
a tank circuit;
at least a first and a second capacitor; and
a first and a second active device, each being an N-channel metal oxide field effect transistor and having at least a drain and a gate,
wherein the gate of the first active device is connected to a side of the first capacitor and the drain of the second active device, the gate of the second active device is connected to a side of the second capacitor and the drain of the first active device, and the tank circuit is connected in between another side of the first capacitor and another side of the second capacitor to direct current decouple the tank circuit from the first and second active devices.

24. A tank based oscillator, comprising:
a tank circuit;
at least a first, a second, a third, and a fourth capacitor; and
a first and a second active device, each being an N-channel metal oxide field effect transistor and having at least a drain and a gate,
wherein the gate of the first active device is connected to a side of the first capacitor and a side of the third capacitor, the gate of the second active device is connected to a side of the second capacitor and a side of the fourth capacitor, another side of the first capacitor is connected to the drain of the second active device, another side of the second capacitor is connected to the drain of the first active device, and the tank circuit is connected in between another side of the third capacitor and another side of the fourth capacitor to direct current decouple the tank circuit from the first and second active devices.

25. A tank based oscillator, comprising:
a tank circuit;
at least a first, a second, a third, a fourth, and a fifth capacitor; and
a first and a second active device, each being an N-channel metal oxide field effect transistor and having at least a drain and a gate,
wherein the gate of the first active device is connected to a side of the first capacitor and a side of the fifth capacitor, the gate of the second active device is connected to a side of the second capacitor and another side of the fifth capacitor, another side of the first capacitor is connected to the drain of the second active device and a side of the fourth capacitor, another side of the second capacitor is connected to the drain of the first active device and a side of the third capacitor, and the tank circuit is connected in between another side of the third capacitor and another side of the fourth capacitor to direct current decouple the tank circuit from the first and second active devices.

* * * * *